United States Patent
Lerner (10) Patent No.: US 11,437,266 B2
(45) Date of Patent: Sep. 6, 2022

(54) METHOD OF MANUFACTURING SEMICONDUCTOR DEVICES TO INCREASE YIELD IN MICRO-TRANSFER PRINTING

(71) Applicant: X-FAB Semiconductor Foundries GmbH, Erfurt (DE)

(72) Inventor: Ralf Lerner, Erfurt (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 16/921,219

(22) Filed: Jul. 6, 2020

(65) Prior Publication Data

US 2021/0005497 A1 Jan. 7, 2021

(30) Foreign Application Priority Data

Jul. 5, 2019 (DE) .................... 10 2019 118 270.0

(51) Int. Cl.
*H01L 21/683* (2006.01)
*H01L 21/66* (2006.01)
*H01L 25/16* (2006.01)

(52) U.S. Cl.
CPC .......... *H01L 21/6835* (2013.01); *H01L 22/20* (2013.01); *H01L 25/16* (2013.01); *H01L 25/167* (2013.01); *H01L 2221/68363* (2013.01)

(58) Field of Classification Search
CPC ..... H01L 21/6835; H01L 22/20; H01L 25/16; H01L 25/167; H01L 2221/68363; H01L 2221/68368; H01L 2221/68354; H01L 21/67288; H01L 21/67144

USPC ........................................... 438/15
See application file for complete search history.

(56) References Cited

U.S. PATENT DOCUMENTS

| 5,911,456 | A  | * | 6/1999 | Tsubouchi | ........... | H05K 13/041 |
|---|---|---|---|---|---|---|
|  |  |  |  |  |  | 29/833 |
| 8,349,116 | B1 | * | 1/2013 | Bibi | ................ | H01L 29/167 |
|  |  |  |  |  |  | 156/249 |
| 10,325,893 | B2 | * | 6/2019 | Chong | ................ | H01L 33/0093 |
| 2017/0186730 | A1 | * | 6/2017 | Shen | .................... | H01L 21/568 |
| 2019/0115235 | A1 | * | 4/2019 | Ahn | ...................... | H01L 22/20 |

* cited by examiner

Primary Examiner — Vu A Vu
(74) *Attorney, Agent, or Firm* — Greenberg Traurig LLP (57) ABSTRACT

Methods for mounting devices on a non-native substrate by a transfer stamp are disclosed. A method may include providing (102) a first semiconductor wafer (300) comprising mostly functional first devices (304) and a few non-functional first devices (302) in a first grid pattern (x, y); providing (102) a second semiconductor wafer (400) comprising second devices (402) in a second grid pattern (x', y'); removing (108) the non-functional first devices (302) from the first semiconductor wafer (300) in respective individual first transfer printing steps; transferring (110) a plurality of the functional first devices (304) from the first semiconductor wafer (300) to the associated second devices (402) of the second semiconductor wafer (400) in a second transfer printing step; and transferring (112) individual functional first devices (304) of the first semiconductor wafer (300) to second devices not having first devices printed thereon (408) in respective individual third transfer printing steps.

21 Claims, 7 Drawing Sheets

METHOD OF MANUFACTURING SEMICONDUCTOR DEVICES TO INCREASE YIELD IN MICRO-TRANSFER PRINTING

BACKGROUND OF THE INVENTION

1. Field of the Invention

The invention relates to a method of manufacturing semiconductor devices for increasing the yield in micro-transfer printing.

2. Description of the Related Art

Micro-transfer printing (μTP) comprises methods in which micro-scale components or devices can be mounted on a non-native substrate by a transfer stamp. Micro-transfer printing is a highly scalable method in which a plurality of devices can be connected to each other in one process step.

Here, the yield of a manufacturing method of semiconductor devices, for example, integrated circuits (ICs), indicates a measure by which the manufacturing process or the chip design can be evaluated. Generally, the yield of a considered semiconductor disk is obtained from the ratio of the number of functional devices to the number of devices that can be collectively fabricated on the semiconductor disk (wafer) including the non-functional devices.

The entire yield in the manufacture of integrated circuits by micro-transfer printing is obtained when considering all process steps of the overall process:
- yield A that is obtained after etching free the devices,
- yield B of the actual transfer printing, and
- yield C that could not have been obtained on the non-native substrate.

The entire yield composed of the three components A, B and C is primarily determined by the numerically lowest yield and is capped. The entire yield in transfer printing of, for example, gallium nitride (GaN) devices (as a more recent method in industry) is less than in already mature methods, e.g. transfer printing of CMOS devices.

Various micro-transfer printing methods are known from the prior art. In particular, methods are known in which the components are transferred from a first semiconductor wafer to a non-native substrate, in most cases a second semiconductor wafer, by an elastomeric stamp.

US 2009/0294803 A1, DE 11 2011 101 135 T5 and U.S. Pat. No. 8,664,699 B2 describe the technique of transfer printing wherein semiconductor devices can be transferred from a first semiconductor wafer to a new substrate by a stamp made of an elastomeric material. This second substrate may, for example, also be a second semiconductor wafer. The devices to be transferred are initially masked and then etched free on the sides. In this etching step, etching is performed around the device except for small so-called breakable connection elements. In a next etching step, material is etched away from beneath the device so that the device is now substantially exposed and is mechanically retained by the connection elements only. Some devices are brought into conformal contact with the surface of the stamp so that these devices can be released from the first semiconductor wafer by means of adhesion to the stamp, i.e. the connection elements are broken. Subsequently, the devices adhering to the stamp are brought into conformal contact with the new carrier substrate and fixed thereto.

Using this method it is, for example, possible to transfer, per stamping operation, a plurality of devices, e.g. gallium nitride transistors (GaN transistors), fabricated on a first carrier substrate from a first semiconductor wafer to a second semiconductor wafer, wherein the first and the second semiconductor wafers can differ from each other in one or more properties. For example, the semiconductor wafers serving as corresponding carrier substrates can differ in the type of material, crystal orientation, wafer diameter, and wafer thickness, and various process techniques are employed, if necessary, to fabricate the desired devices or components on the respective carrier substrates. After transfer printing, for example, insulating layers and/or conductive layers can be deposited over the second carrier substrate which now comprises the previously transferred devices in suitable positions, and structured subsequently thereto in further semiconductor-process processing steps to establish the mechanical and/or electrical and/or optical connections required for the desired function. The processing on the basis of the entire carrier substrate enables a cost-effective manufacturing since the processing is performed for a plurality of combined devices, e.g. circuits, in the same work step, as is also known from the manufacture of standard integrated circuits. For example, GaN transistors with high electron mobility and thus high conductivity can be covered by an insulating layer provided with vias, structured, and wired to a metal layer after transfer thereof to another suitable carrier substrate.

U.S. Pat. No. 7,932,123 B2 describes methods in which the functional structures produced on a suitable carrier substrate are made "printable" by means of a plurality of so-called "release layers" so that they can be transferred to another carrier substrate.

U.S. Pat. No. 7,943,491 B2 and US 2013/0069275 A1 describe a kinetically controlled method wherein the adhesion forces occurring between a device to be transferred and the transfer stamp are changed by the release rate or separation rate to temporarily attach the devices to be transferred to the stamp, and to finally fix them to the receiver. In the case of a fast separation, high adhesion forces are created so that the devices temporarily adhere to the stamp and are released from the donor. On the other hand, releasing of the devices from the transfer stamp is achieved by a low separation rate and thus by a low adhesion force.

U.S. Pat. No. 7,799,699 B2 describes the etching free of AlGaN/GaN heterostructure components on (111) silicon. By suitable masking and vertical plasma etching, exposed, i.e. unmasked trenches are etched beside the device. In the horizontal direction, the devices are etched free by etching the silicon carrier substrate beneath the component with tetramethylammonium hydroxide (THAH). Mechanical fixing is in the horizontal direction is accomplished by suitable interruptions of the trenches. Said interruptions can be material bridges or connection elements that are not etched away.

US 2013/0210194 A1 discloses an electrostatic transfer method and relates to a transfer printing method with elastomeric stamps. A method is described which includes a first carrier comprising first devices provided thereon in the form a grid pattern and a second carrier comprising functional devices, such as transistors, as second devices, also in the form of grid pattern. The releasing from the first carrier is performed by a head/stamp. A plurality of first devices are applied to the second carrier, while maintaining the grid pattern. Further first devices that have not yet been released from the first carrier are available for application to the second carrier in not yet occupied positions.

EP 2 339 614 A1 shows a transfer method including a first carrier and first devices, such as MEMS or CMOS, fabricated thereon in a grid pattern, and a second carrier, such as a PCB or device carrier substrate, comprising second devices, wherein a further carrier releases the devices from the first carrier and applies them to the second carrier.

WO 2010/059781 A1 describes various factors influencing the yield of the actual transfer printing process: The "shear offset" in FIG. 5, or the "delamination rate" and the "transfer surface". The yields of the two wafers involved, the first and the second semiconductor wafer, are not taken into consideration here.

Similarly, also in U.S. Pat. No. 9,827,799 B2, the yield of the actual transfer printing is taken into consideration. Here, the influence of a sacrificial layer is shown in FIG. 3a (cf. col. 7, line 63), and the influence of the etching time is illustrated in FIG. 4 (cf. col 8, line 21).

In the methods known from the prior art, the focus is on yield B, i.e. the yield of the actual transfer printing. The corresponding stamp used for the (actual) transfer printing is brought into conformal contact with the surface of a first semiconductor wafer or the semiconductor devices located thereon, and the semiconductor devices can be released from the first semiconductor wafer and transferred to the second semiconductor wafer by adhesion to the stamp. Adhesion between the semiconductor devices and the stamp is highly dependent on the delamination rate [mm/s]: As the delamination rate (separation rate) increases, the adhesion forces between the stamp and the semiconductor device to be transferred exceed the connection forces between the semiconductor device and the substrate so that the semiconductor devices can be released and transferred. Both, functional and non-functional devices are released from the first semiconductor wafer and transferred to the second semiconductor wafer here.

SUMMARY OF THE INVENTION

It is an object of the claimed method to cause an increase in yield in the manufacture of micro-devices by micro-transfer printing, especially in the manufacture of micro-devices in which the numerically lowest yield is determined by the yield that is obtained after etching free the devices on the first semiconductor wafer.

This object is achieved by a method of manufacturing semiconductor devices. Providing a first semiconductor wafer comprising mostly functional first devices and a few non-functional first devices in a first grid pattern. Providing a second semiconductor wafer comprising second devices in a second grid pattern. Removing the non-functional first devices from the first semiconductor wafer in respective individual first transfer printing steps. Transferring a plurality of the functional first devices from the first semiconductor wafer to the associated second devices of the second semiconductor wafer in a second transfer printing step. Transferring individual functional first devices of the first semiconductor wafer to second devices not having first devices printed thereon in respective individual third transfer printing steps.

The method can comprise a plurality of process steps. The method can comprise process steps including preparatory steps, micro-transfer printing steps, and post-processing steps.

The method includes providing a first semiconductor wafer comprising mostly functional first devices and a few non-functional first devices in a first grid pattern. The method comprises providing a second semiconductor wafer comprising second devices. Furthermore, the method comprises removing the non-functional first devices from the first semiconductor wafer in respective individual first transfer printing steps. The method comprises transferring a plurality of the functional first devices from the first semiconductor wafer to the associated second devices of the second semiconductor wafer in a second transfer printing step. Moreover, the method comprises transferring individual functional first devices of the first semiconductor wafer to second devices not having first devices printed thereon in respective individual third transfer printing steps.

In this context, "mostly functional first devices" means that, from a numbers perspective, more functional first devices are located on the first semiconductor wafer than non-functional devices ("a few non-functional devices"). From a proportional perspective, especially a minimum of 80% of all first devices on the first semiconductor wafer can be functional and a maximum of 20% of the first devices can be non-functional so that "mostly functional devices" are present.

The first semiconductor wafer can be a circular or square wafer. The first semiconductor wafer can be made of monocrystalline or polycrystalline materials. The first semiconductor wafer can be designed such that it serves as a substrate (base plate) for electronic devices, preferably integrated circuits, micro-mechanical devices or photoelectric coatings. The first semiconductor wafer can have a thickness of up to 1.0 mm, preferably a thickness within a range of between 0.275 and 0,925 mm. The diameter of the first semiconductor wafer can be within a range of between 50.0 mm and 450.0 mm, preferably the diameter can be within a range of between 100.0 and 300.0 mm. The first semiconductor wafer can be made of monocrystalline silicon, silicon carbide, gallium arsenide, or indium phosphide.

The first devices can be integrated circuits or micro-mechanical devices. Functional first devices can be devices that serve their functional use, e.g. a functional pair of scissors is a pair of scissors capable of cutting something. Thus, conversely, non-functional devices can be devices not capable of serving their functional use.

The first devices (both, functional and non-functional) can be arranged in a grid pattern in a plane. The plane can be congruent with the plane that is spanned by a surface of the first semiconductor wafer. The coordinates in the plane can be clearly defined or expressed by an x-y-coordinate system lying in the plane. The grid pattern can be a network of lines for dividing the surface of the first semiconductor wafer into a plurality of segments so that contours of the first devices are defined on the first semiconductor wafer.

The second semiconductor wafer can be a circular or square wafer. The second semiconductor wafer can be made of monocrystalline or polycrystalline materials. The second semiconductor wafer can be designed such that it serves as a substrate (base plate) for electronic devices, preferably integrated circuits, micro-mechanical devices or photoelectric coatings. The second semiconductor wafer can have a thickness of up to 1.0 mm, preferably a thickness within a range of between 0.275 and 0,925 mm. The diameter of the second semiconductor wafer can be within a range of between 50.0 mm and 450.0 mm, preferably the diameter can be within a range of between 100.0 and 300.0 mm. The second semiconductor wafer can be made of monocrystalline silicon, silicon carbide, gallium arsenide, or indium phosphide.

The second devices can be integrated circuits or micro-mechanical devices.

The second devices can be arranged in a grid pattern in a plane. The plane can be congruent with the plane that is spanned by a surface of the second semiconductor wafer. The coordinates in the plane can be clearly defined or expressed by an x-y-coordinate system lying in the plane. The grid pattern can be a network of lines for dividing the surface of the second semiconductor wafer into a plurality of segments so that contours of the second devices are defined on the second semiconductor wafer.

The arrangement of the first and second devices on the first and second semiconductor wafers in a grid pattern can enable (micro) transfer printing of a plurality of first devices (as an array) from the first semiconductor wafer to the second semiconductor wafer. In combination with a stamp scaled to the semiconductor wafers, the yield of devices to be transferred can be further increased.

The respective individual first transfer printing steps for removing the non-functional first devices can be performed by one transfer printing stamp or by a plurality of transfer printing stamps operating in parallel for removing isolated non-functional first devices.

The second transfer printing step for transferring the plurality of the functional first devices from the first semiconductor wafer to the associated second devices of the second semiconductor wafer can be performed by a transfer printing stamp that is scaled to the first and/or the second semiconductor wafer.

The respective individual third transfer printing steps for transferring individual functional first devices of the first semiconductor wafer to second devices not having first devices printed thereon can be performed by one transfer printing stamp or by a plurality of a plurality of transfer printing stamps operating in parallel for transferring isolated functional first devices.

Due to the combination of individual transfer printing steps (individual first and third transfer printing steps) in which isolated non-functional first devices are removed, and functional first devices are transferred to unoccupied positions on the second devices on the second semiconductor wafer, respectively, the yield A can be increased to 100%. Thus, the overall yield that is obtained as a product of yields A, B and C is increased as well.

The second transfer printing step preferably comprises transferring the functional first devices to the devices of the second semiconductor wafer in a third grid pattern so that second devices having functional first devices printed thereon and second devices not yet having a first device printed thereon are located on the second semiconductor wafer after the second transfer printing step.

The third grid pattern can be integrated into a surface of a transfer stamp that can be used for the second transfer printing step. The surface can be suited to pick up the first devices. Preferably, the surface is designed such that the first devices are adhesively held on the surface. The grid pattern can be arranged in a plane. The plane can be congruent with the plane that is spanned by the surface of the transfer stamp. The grid pattern can be a network of lines for dividing the surface of transfer stamp into a plurality of segments so that the contours created thereby substantially correspond to the contours of the first devices on the first semiconductor wafer.

The first, second and/or third grid patterns can be similar to each other in design so that additional preparatory steps for the second transfer printing step, for example, arranging the first devices in accordance with the second grid pattern of the second devices on the second semiconductor wafer, can be omitted. The transfer printing stamp for the second transfer printing step can be adapted in accordance with the first, second and/or third grid pattern.

Preferably, the method can comprise detecting non-functional first devices on the first semiconductor wafer prior to removing them in the first transfer printing steps.

The detecting of non-functional first devices on the first semiconductor wafer can be performed by tactile, optical, and/or acoustic methods. In particular, tactile, optical, or acoustic methods can be used for measuring or detecting the geometry and/or material properties of the first devices. The detected data (geometry, material properties, etc.) can be used as a basis for evaluating the functionality of the first devices.

Non-functional first devices can be detected by an optical method, especially by an automated optical or electrical inspection or measurement.

The optical method as an automated optical inspection (AOI) can comprise systems that are capable of finding and notifying errors by means of image processing methods. Errors can render the devices non-functional. Errors can include missing or wrong devices, displaced devices, and/or contamination of the devices. In the image processing method, images can be captured by scanners or cameras.

The first transfer printing steps designed for individual devices can be performed repeatedly in sequence.

Individual devices can include the non-functional first devices. The first transfer printing steps designed for individual devices can include removing a single non-functional first device.

In the first transfer printing steps designed for individual devices, a transfer stamp can be used that is designed such that the transfer stamp picks up a single non-functional first device.

By using a transfer stamp designed for individual devices, especially for the first devices on the first semiconductor wafer, removing non-functional devices (that are low in number as compared to the functional devices) can be enabled.

In the first transfer printing steps designed for individual devices, a plurality of transfer stamps operating in parallel can be used that are designed such that they each pick up a single non-functional first device.

By using transfer stamps operating in parallel for removing non-functional first devices, the yield can be increased while decreasing the production time.

The first and the second semiconductor wafers can have the same wafer diameter.

The same dimensioning of the first and the second semiconductor wafers can facilitate scaling of the transfer stamp used for the second (actual) transfer printing step in order to increase the maximum number of devices that can be printed simultaneously.

In the second transfer printing step, a transfer stamp can be used that is designed such that the transfer stamp picks up a plurality of functional devices on the first semiconductor wafer.

By transferring a plurality of functional first devices using the transfer printing stamp in the second transfer printing step, a plurality of first and second devices can be combined or first devices can be printed onto second devices in parallel operation in one step.

The third transfer printing steps designed for individual devices can be performed repeatedly in sequence.

Individual devices can include the functional first devices. The first transfer printing steps designed for individual devices can include transferring a single functional first device.

In the third transfer printing steps designed for individual devices, a transfer stamp can be used that is designed such the transfer stamp picks up a single functional first device.

By using a transfer stamp designed for individual devices, especially for the first devices, transferring functional devices can be enabled.

In the third transfer printing steps designed for individual devices, a plurality of transfer stamps operating in parallel can be used that are designed such that they each pick up a single functional first device.

By using transfer stamps operating in parallel for transferring functional first devices to the second devices onto which no functional first device has yet been printed, the yield can be increased while decreasing the production time.

All transfer printing stamps used in the method in the first transfer printing steps, the second transfer printing step and the third transfer printing steps can be elastomeric stamps, for example, stamps made of or coated with polydimethylsiloxane (PDMS). The picking up, transferring and removing, respectively, of the first devices can include that the stamp is contacted with the first devices on the surface on which the first devices are located and the first devices are then moved away from the surface of the first semiconductor wafer. By accelerating the stamp contacting the first devices in combination with the rate-dependent (peeling rate) adhesion between the viscoelastic (elastomeric) stamp and the first devices, which adhesion is adjustable due to the use of a corresponding elastomer, the first devices can be moved to a desired destination.

The first and second devices preferably differ from each other, especially in the type of material, crystal orientation, geometry, and/or thickness.

The first devices on the first semiconductor wafer can be GaN devices, and the second devices on the second semiconductor wafer can be CMOS circuits.

Preferably, the first devices on the first semiconductor wafer can also be LEDs, Hall sensors, optical filters, or MEMS elements.

Further preferably, the first devices on the first semiconductor wafer can be CMOS circuits, and the second devices on the second semiconductor wafer can be GaN devices.

The first semiconductor wafer and the second semiconductor wafer can differ from each other, especially in the type of material, crystal orientation, wafer diameter, and/or wafer thickness.

After transferring individual functional first devices to the second devices not having first devices printed thereon in respective individual third transfer printing steps, depositing of at least one insulating layer and/or at least one conductive layer on the second semiconductor wafer can be carried out. The method can include structuring the at least one insulating layer and/or the at least one conductive layer on the second semiconductor wafer.

Prior to the first transfer printing steps, the first devices on the first semiconductor wafer can be retained laterally by connection elements (so-called tethers), especially after etching free the first devices from the first semiconductor wafer prior to the providing step.

The connection elements retain the first devices in a spatially stable manner on the first semiconductor wafer. The connection elements can be designed such that they break or split in a controlled manner in the first transfer printing steps or in the second transfer printing step. In addition to connection elements (as predetermined breaking points), other sacrificial release strategies can be employed.

BRIEF DESCRIPTION OF THE DRAWINGS

The embodiments of the invention are illustrated by examples, however, not in a way that transfers or incorporates limitations from the Figures into the patent claims. Same reference numerals in the Figures denote similar elements.

DETAILED DESCRIPTION OF PREFERRED EMBODIMENTS

Figure 2:
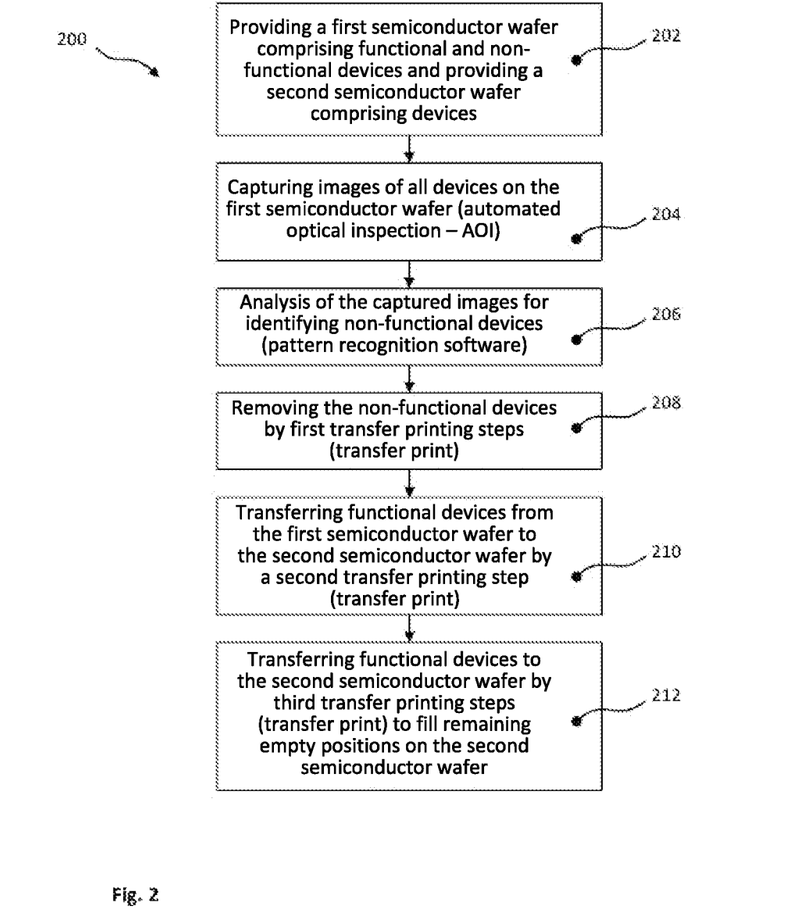
FIG. 2 shows a flow chart as a further embodiment of a method 200 of manufacturing semiconductor devices including an increase in yield in micro-transfer printing.
Figure 3:
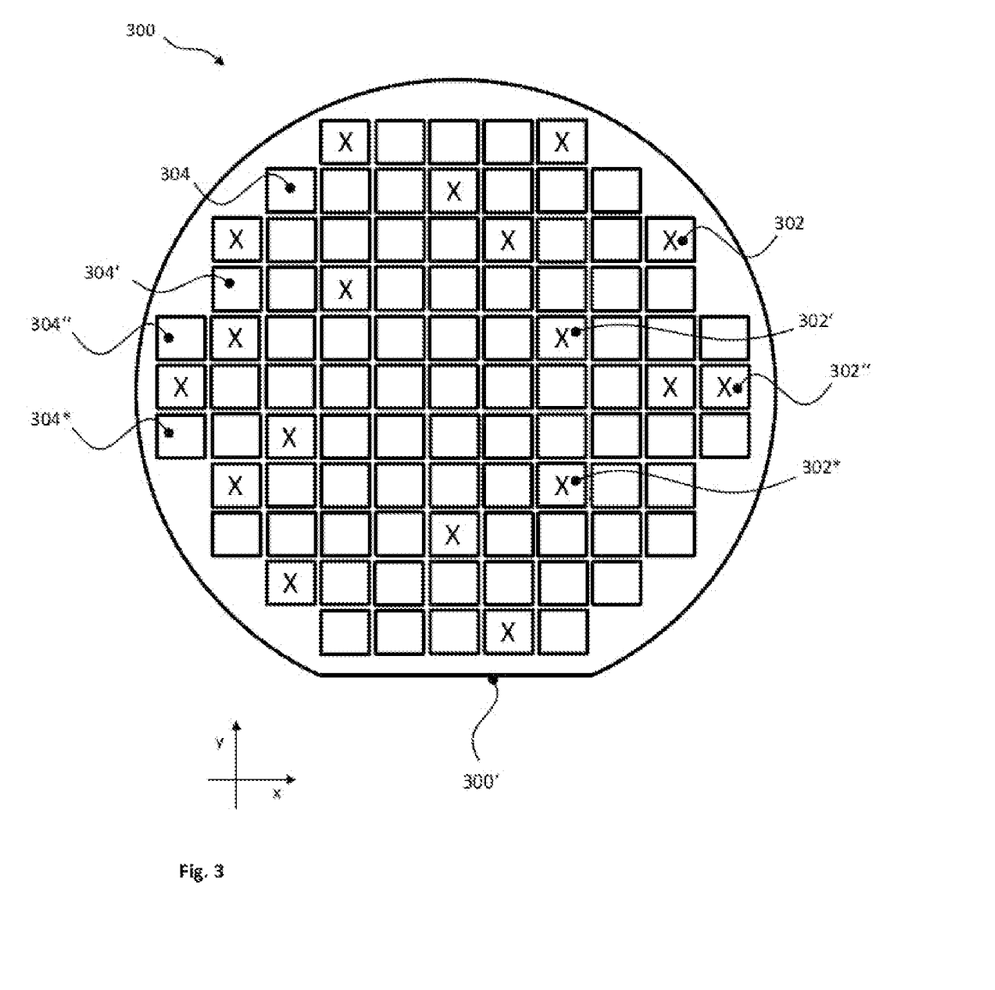
FIG. 3 shows a first semiconductor wafer 300 comprising functional 304 and non-functional 302 first devices prior to first micro-transfer printing steps.
Figure 4:
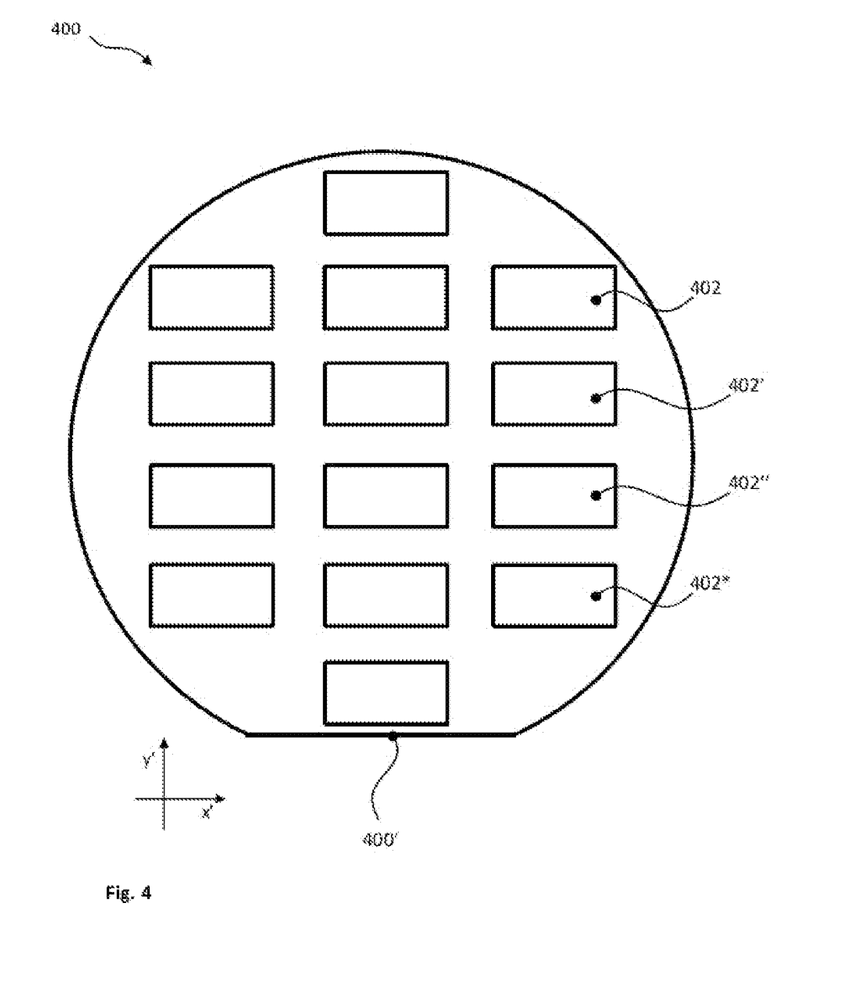
FIG. 4 shows a second semiconductor wafer 400 comprising second devices 402 prior to a second micro-transfer printing step.

The descriptions of FIGS. 3 and 4 are provided earlier so that the explanations on the method illustrated in flow chart 1 (or flow chart 2) can be understood more easily.

FIG. 3 shows a first semiconductor wafer 300 comprising functional 304 and non-functional 302 first devices prior to first micro-transfer printing steps.

The first semiconductor wafer 300 has a substantially circular basic shape. The first semiconductor wafer 300 comprises an area having a reduced radial diameter 300'. A plurality of functional first devices 304, 304', 304" . . . 304\* and non-functional first devices 302, 302', 302" . . . 302\* are arranged on the first semiconductor wafer 300. Non-functional devices 302 are marked by an X. The coordinates on the first semiconductor wafer 300 are clearly defined by an x-y coordinate system lying in the plane of the first semiconductor wafer 300. The first devices 302, 304 are arranged in a grid pattern in the plane of the first semiconductor wafer 300 (x-y plane).

The first semiconductor wafer 300 can be square wafer.

The first semiconductor wafer 300 can be made of monocrystalline or polycrystalline materials.

The first semiconductor wafer 300 can be designed such that it serves as a substrate (base plate) for electronic devices, preferably integrated circuits, micro-mechanical devices, or photoelectric coatings as first devices, among which the devices 302 are damaged or defective so that their intended function is not given, i.e. they are non-functional.

After the actual manufacture, it might be assumed that all first devices are intact (functional) devices 304, however, in reality it may happen that some of the first devices are defective. These defective (non-functional) devices are denoted by 302, but would at best also be functional devices 304.

The first semiconductor wafer 300 can have a thickness within a range of between 0.275 and 0.925 mm, preferably a thickness of 1.0 mm.

The diameter of the first semiconductor wafer 300 can be within a range of between 50.0 mm and 450.0 mm, preferably a diameter within a range of between 100.0 and 300.0 mm.

The first semiconductor wafer 300 can be made of monocrystalline silicon, silicon carbide, gallium arsenide, or indium phosphide.

The area having a reduced diameter on one side 300' can be a straight edge on one side of the first semiconductor wafer 300 (a so-called flat).

The area having a reduced diameter on one side 300' can be a lateral recess in one side of the first semiconductor wafer 300 (a so-called notch).

The area having a reduced diameter on one side 300' can be designed such that it indicates the crystal orientation of the first semiconductor wafer 300.

The area having a reduced diameter on one side 300' can be designed such that it can be used for precisely positioning the first semiconductor wafer 300 in a manufacturing plant for semiconductors.

The area having a reduced diameter on one side 300' can comprise a plurality of areas having a reduced diameter on one side.

After the devices 302, 304 are fabricated on the carrier wafer 300, there are also devices 302 that are defective, i.e. that are not capable of fulfilling their function. They are referred to as non-functional.

The first devices (functional first 304 and non-functional first devices 302 on the first semiconductor wafer 300) can be integrated circuits or micro-mechanical devices.

The first devices can have a substantially rectangular basic shape.

Functional first devices 304 are devices that can serve their functional use. Conversely, non-functional devices 302 are devices that cannot serve their intended functional use.

The plurality of functional first devices 304, 304' . . . 300* will be considerably greater than the number of non-functional first devices 302, 302' . . . 302*.

The grid pattern can be a network of lines for dividing the surface of the first semiconductor wafer 300 into a plurality of segments so that contours of the first devices are defined on the first semiconductor wafer 300.

The first devices can be spaced laterally in a uniform arrangement, preferably in a grid pattern, on the first semiconductor wafer 300.

The first devices can be retained laterally by connection elements (not shown) (so-called tethers). The connection elements can connect all first devices on the first semiconductor wafer 300 in such a manner that they are held spatially stable even when they are etched free.

The connection elements are designed such that they break in a controlled manner when a force is applied. After breaking, the residues thereof are visible at the first devices, but are not shown here.

FIG. 4 shows a second semiconductor wafer 400 comprising second devices 402 prior to a second micro-transfer printing step. These devices are different devices than the first devices.

The second semiconductor wafer 400 also has a substantially circular shape. The second semiconductor wafer 400 comprises an area having a reduced radial diameter 400'. A plurality of functional devices 402, 402', 402" . . . 402* are arranged on the second semiconductor wafer 400. The coordinates on the second semiconductor wafer 400 are clearly defined by an x'-y' coordinate system lying in the plane of the second semiconductor wafer 400. The second devices 402 are arranged in a grid pattern in the plane of the second semiconductor wafer 400 (x'-y' plane).

Just as the first semiconductor wafer 300, the second semiconductor wafer 400 can be a circular or square wafer, have a thickness within a range of between 0.275 and 0.925 mm, and have a diameter within a range of between 50.0 mm and 450.0 mm.

Preferably, the second semiconductor wafer 400 has a thickness of 1.0 mm and a diameter within a range of between 100.0 and 300.0 mm.

The second semiconductor wafer 400 can also be made of monocrystalline or polycrystalline materials, preferably the second semiconductor wafer is made of monocrystalline silicon, silicon carbide, gallium arsenide, or indium phosphide.

The second semiconductor wafer 400 can be designed such that it serves as a substrate (base plate) for electronic devices, preferably integrated circuits, micro-mechanical devices, or photoelectric coatings.

The area having a reduced diameter on one side 400' can be designed similarly to the area reduced on one side 300' of the first semiconductor wafer 300. The area 400' can be a straight edge on one side of the second semiconductor wafer 400 (a so-called flat), or the area having a reduced diameter on one side 400' can (alternatively) be a lateral recess in one side of the second semiconductor wafer 400 (a so-called notch).

The area having a reduced diameter on one side 400' can also be designed such that it indicates the crystal orientation of the second semiconductor wafer 400.

The area having a reduced diameter on one side 400' can further be designed such that it can be used for precisely positioning the second semiconductor wafer 400 in a manufacturing plant for semiconductors.

The area having a reduced diameter on one side 400' can comprise a plurality of areas having a reduced diameter on one side, e.g. one respective area for precise alignment and one respective area for indicating the wafer type (crystal orientation, p-n doping).

In the example, the plurality of second devices 402, 402' . . . 402* comprise functional devices. When established (well known) methods are used in the manufacture, a very high yield is achieved so that no (or almost no) defective devices are present.

The second devices 402 can be integrated circuits or micro-mechanical devices.

In the shown example, the second devices 402 have a substantially rectangular shape.

The first 302, 304 and second devices 402 preferably differ from each other, especially in the type of material, crystal orientation, geometry, and/or thickness.

The grid pattern can be a network of lines for dividing the surface of the second semiconductor wafer 400 into a plurality of segments so that contours of the second devices 402 are defined on the second semiconductor wafer.

The second devices 402 can be spaced laterally in a uniform arrangement, preferably in a grid pattern, on the second semiconductor wafer 400.

The first 300 and the second 400 semiconductor wafers can have the same wafer diameter.

The first devices 302, 304 on the first semiconductor wafer 300 preferably are GaN devices, and the second devices 402 on the second semiconductor wafer 400 equally preferably are CMOS circuits.

The first devices 302, 304 on the first semiconductor wafer 300 can also be LEDs, Hall sensors, optical filters, or MEMS elements.

Further preferably, the first devices 302, 304 on the first semiconductor wafer 300 can be CMOS circuits, and the second devices 402 on the second semiconductor wafer 400 can be GaN devices.

Figure 1:
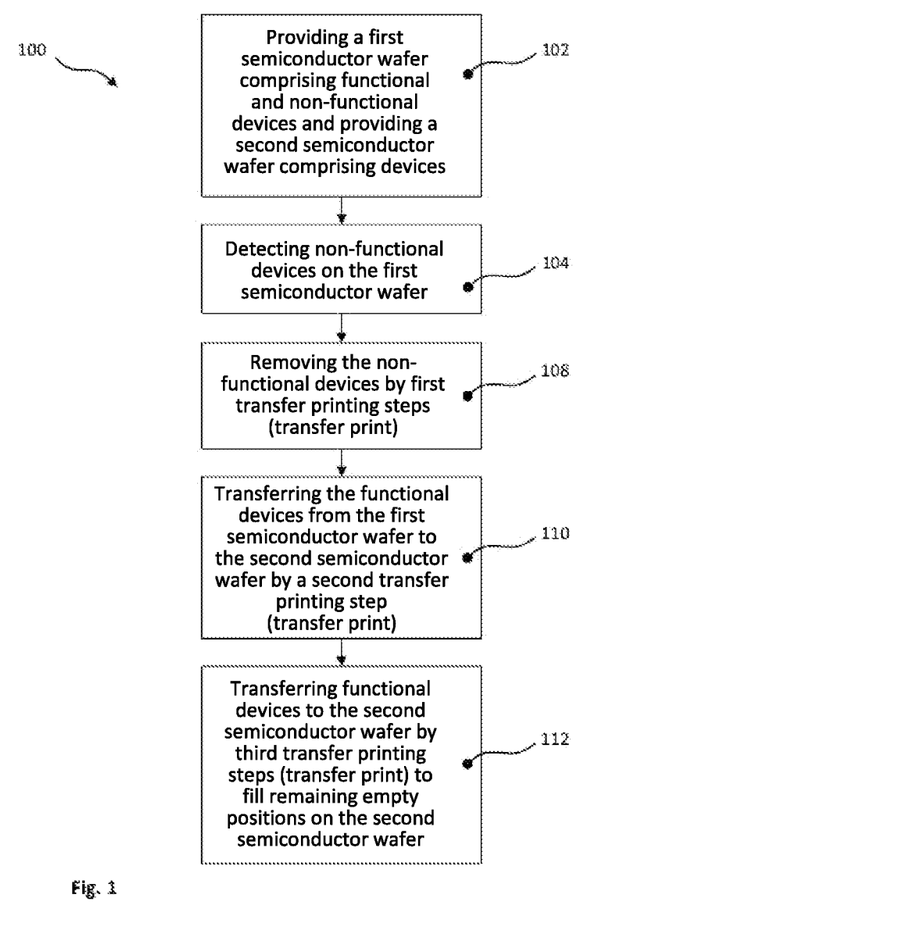
FIG. 1 shows a flow chart of a method 100 of manufacturing semiconductor devices including an increase in yield in micro-transfer printing.

FIG. 1 shows a flow chart of a first method 100 of manufacturing semiconductor devices.

In process step 102, a semiconductor wafer comprising functional devices and a second semiconductor wafer comprising functional devices are provided. However, among the first devices, there are also devices having a damage. They are created during manufacture and are 'provided' in this sense, even though a manufacture of good devices only is intended. With respect to the second devices it is assumed that only good devices are created and a very high yield (almost 100%) is achieved, respectively.

The semiconductor wafer comprising functional and non-functional devices can be a first semiconductor wafer 300 comprising functional 304 and non-functional 302 devices, as described with reference to FIG. 3, and the second semiconductor wafer can be a second semiconductor wafer 400 comprising devices 402 according to FIG. 4. In particular, the first semiconductor wafer 300 can be a semiconductor wafer with exposed first devices.

The providing of the first 300 and second 400 semiconductor wafers can include that the semiconductor wafers 300, 400 are provided by a manufacturing plant for manufacturing semiconductor devices. Here, the providing can be carried out in such a manner that the manufacturing plant can perform further process steps on the first 300 and/or second 400 semiconductor wafer. The individual process steps are not illustrated here.

In a further step 104, the non-functional devices 302 on the first semiconductor wafer 300 are detected. The detecting of non-functional first devices 302 on the first semiconductor wafer 302 can be performed by tactile, optical, and/or acoustic methods. In particular, tactile, optical, or acoustic methods can be used to measure or detect the geometry and/or material properties of the first devices.

The detected data (geometry, material properties, etc.) can serve as a basis for evaluating the functionality of the first devices, i.e. whether they are to be classified as devices 302 (non-functional) or as devices 304 (functional).

Measuring devices, especially for tactile, optical, and/or acoustic measuring methods can be integrated in the manufacturing plant. Preferably, this involves optical measuring methods and corresponding measuring devices.

Optical methods can be implemented as an automated optical inspection (AOI) system that that is capable of finding and notifying errors in the device (in the first devices) by means of image processing methods. Errors can cause that devices are marked as non-functional and their x-y position is stored. Then, they are non-functional devices 302. Errors can include missing or wrong devices, displaced devices, and/or contamination of the devices. In the image processing method (AOI), images can be captured by scanners or cameras.

In step 108, the devices 302 identified as non-functional are removed from the first semiconductor wafer 300 by respective individual first transfer printing steps. Only good devices 304 remain on the wafer 300.

For a better understanding, it is firstly referred to FIG. 5 in the following so that process steps 110 and 112 can be understood more easily.

Figure 5:
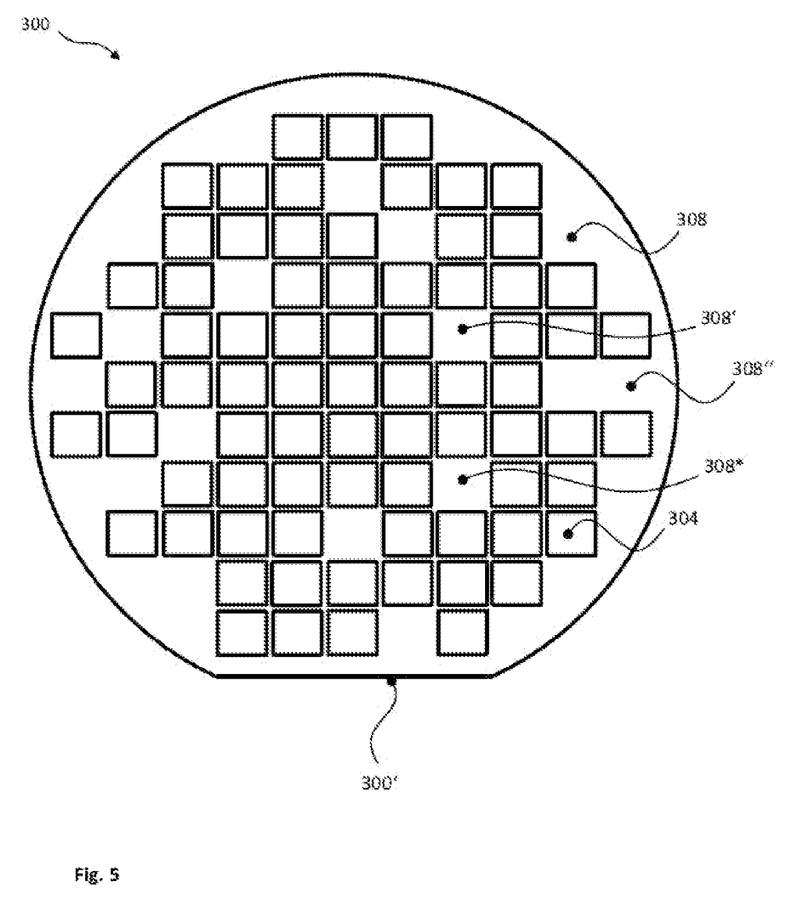
FIG. 5 shows the first semiconductor wafer 300 comprising functional first devices 302 only after the first micro-transfer printing steps.

FIG. 5 shows the first semiconductor wafer 300 comprising functional first devices 302 only after the first micro-transfer printing steps. In addition to the functional first devices 304, the first semiconductor wafer 300 comprises a plurality of unoccupied positions 308, 308', 308" . . . 308* that correspond to the positions of the non-functional devices 302 formerly located on the first semiconductor wafer 300.

The respective individual first transfer printing steps for removing the non-functional devices 302 can be performed by one transfer printing stamp or by a plurality of transfer printing stamps operating in parallel for removing isolated non-functional first devices 302.

Here, the first transfer printing steps designed for individual devices can be performed repeatedly in sequence.

In the first transfer printing steps designed for individual devices, a transfer stamp can be used that is designed such that the transfer stamp picks up a single non-functional first device 302 (and removes it from the wafer).

In the first transfer printing steps designed for individual devices, a plurality of transfer stamps operating in parallel can be used that are designed such that they each pick up (and remove) a single no longer functional first device.

In step 110, the functional first devices 304 are transferred to the second semiconductor wafer 400 in a second transfer printing step.

In the second transfer printing step of the example, a transfer printing stamp is used that is designed such that the transfer printing stamp simultaneously picks up a plurality of functional devices 304 on the first semiconductor wafer 300 and transfers them to the second wafer and its devices.

The transfer stamp used in the second transfer printing step can be designed such that the functional devices 304 are picked up in a grid pattern of the stamp in such a manner that they correspond to the grid pattern in which the second devices 402 are arranged on the second semiconductor wafer.

The functional first devices 304 are transferred from the first semiconductor wafer 300 onto the second devices 402 of the second semiconductor wafer 400 by the transfer printing stamp in the second transfer printing step.

The transfer stamp used in the second transfer printing step can be scaled to the second semiconductor wafer 400. Functional devices 304 can be transferred repeatedly in succession from the first semiconductor wafer 300 onto devices 402 of a plurality of semiconductor wafers 400 by the scaled stamp. In the second transfer printing, devices 304 are picked up from the first semiconductor wafer 300, each offset by one position, in the second transfer printing step that is performed repeatedly in succession. In this example, a multiple of first devices are located on the first semiconductor wafer as compared to the number of devices on the second semiconductor wafer.

The removing of the non-functional devices 302 from the first semiconductor wafer 300 can cause that the transfer printing stamp used in the second transfer printing step has unoccupied positions after picking up the functional devices 304 since there was no functional device 304 at the corresponding position 308 so that second devices having functional devices printed thereon and second devices not yet having devices printed thereon are present on the second semiconductor wafer 400 after the second transfer printing step.

Figure 6:
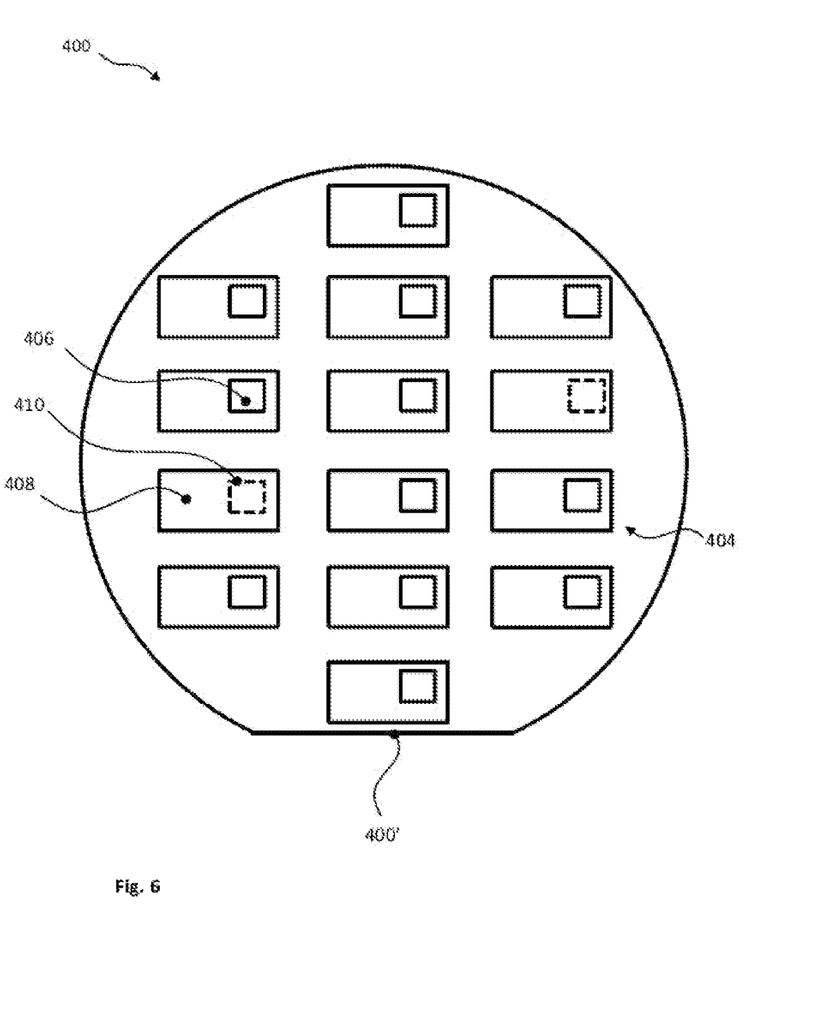
FIG. 6 shows the second semiconductor wafer 400 comprising printed devices 404 and unprinted second devices 408 after the second micro-transfer printing step.

This is illustrated in FIG. 6. FIG. 6 shows the second semiconductor wafer 400 comprising printed devices (third devices) 404 and unprinted second devices 408 after the second micro-transfer printing step. However, these do not yet have their intended function.

The third devices 404 comprise printed functional first devices 406 (previously 304) and second devices 408 (previously 402). The unprinted second devices 408 have unoccupied positions 410.

In step 112, functional devices 302 are transferred to the second semiconductor wafer 400, i.e. to the empty positions (unoccupied positions) 410 on the second devices 408 of the second semiconductor wafer 400, in respective individual third transfer printing steps.

The third transfer printing steps designed for individual devices can be performed repeatedly in sequence.

In the third transfer printing steps designed for individual devices, a transfer stamp can be used that is designed such that the transfer stamp picks up a single functional first device 304 that is referred to as 406 after it is transfer printed onto the second device 408 and that forms a functionally complete device 404 on the second wafer.

In the third transfer printing steps designed for individual devices, a plurality of transfer stamps operating in parallel can be used that are designed such that they each pick up a single functional first device 304.

The transfer printing stamp (or the transfer printing stamps) for the first transfer printing steps, the transfer printing stamp for the second transfer printing step, and/or the transfer printing stamp (or the transfer printing stamps) for the third transfer printing stamps can be integrated in the manufacturing plant.

All transfer printing stamps used in the method can be elastomeric stamps, for example, stamps made of or coated with polydimethylsiloxane (PDMS).

The transferring or removing of the first devices can include that the stamps are initially contacted with the devices on the surface in the respective transfer printing step and that the first devices are then moved away from the surface of the first semiconductor wafer 300 and moved towards the surface of the second semiconductor wafer 400, respectively.

By accelerating the respective stamp engaging the first devices 304 or the first devices 302, 304 in combination with the rate-dependent (peeling rate) adhesion between the viscoelastic (elastomeric) stamp and the first devices 302, 304, which adhesion is adjustable due to the use of a corresponding elastomer, the first devices can be moved to a desired destination.

Figure 7:
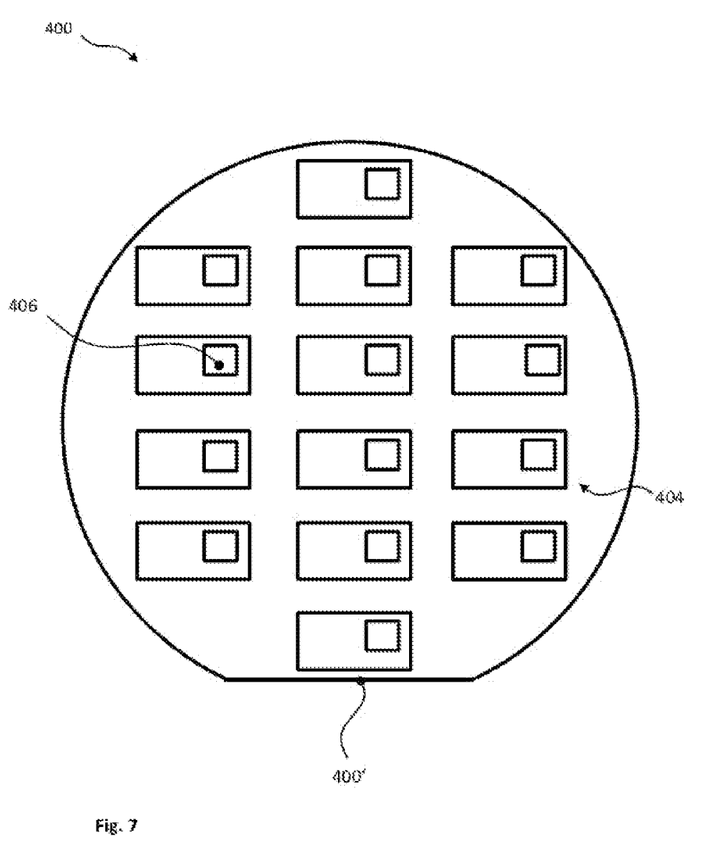
FIG. 7 shows the second semiconductor wafer 400 comprising printed devices 404 only after third micro-transfer printing steps.

After the third transfer printing steps, all unoccupied positions 410 are occupied by functional first devices 304 so that only third devices 404 that are fully functional are located on the second semiconductor wafer 400. This is illustrated in FIG. 7.

After transferring individual functional devices 304 to the second devices 408 (without printed devices 304, then referred to as 406) in respective individual third transfer printing steps, further process steps can be performed on the second semiconductor wafer 400.

After transferring individual functional devices 304 to the second devices 408 (without printed devices 304, then referred to as 406) in respective individual third transfer printing steps, the depositing of at least one insulating layer and/or at least one conductive layer on the second semiconductor wafer 400 can be carried out. The method can further include structuring the at least one insulating layer and/or the at least one conductive layer on the second semiconductor wafer. FIG. 2 shows a flow chart of a further embodiment of a method 200 of manufacturing semiconductor devices by micro-transfer printing.

In process step 202, a semiconductor wafer apparently (visibly) comprising functional devices only is provided. Similarly, a second semiconductor wafer comprising devices that are all functional in the example is provided.

The semiconductor wafer comprising functional and non-functional devices can be a first semiconductor wafer 300 comprising functional 304 and non-functional 302 devices, as described with reference to FIG. 3, and the second semiconductor wafer can be a second semiconductor wafer 400 comprising devices 402 according to FIG. 4. In particular, the first semiconductor wafer 300 can be a semiconductor wafer that is provided after etching free the first devices 302, 304.

The providing of the first 300 and second 400 semiconductor wafers can include that the semiconductor wafers 300, 400 are provided by a manufacturing plant for manufacturing semiconductor devices. Here, the providing can be carried out in such a manner that the manufacturing plant can perform further process steps on the first 300 and/or second 400 semiconductor wafer.

In step 204, images of all devices 302, 304 on the first semiconductor wafer 300 are captured for evaluating the functionality of the first devices 302, 304 in an automated optical inspection (AOI).

The corresponding measuring devices/imaging devices for AOI can be integrated in the manufacturing plant. The imaging devices can be scanners or cameras.

In step 206, the captured images are analyzed for detecting non-functional first devices 302.

In particular, the analysis can reveal errors in the first devices. Errors can render the devices non-functional. Errors can include missing or wrong devices, displaced devices, and/or contamination of the devices.

The three-step transfer printing method that follows in process steps 208 to 212 substantially corresponds to process steps 108 to 112 of the method illustrated in the flow chart of FIG. 1.

Process steps 208 to 212 can be identical with process steps 108 to 112 and to the above-described possible embodiments associated therewith.

The invention claimed is:

1. A method of manufacturing semiconductor devices, comprising:
    (a') providing (102) a first semiconductor wafer (300) comprising mostly functional first devices (304) and a few non-functional first devices (302) in a first grid pattern (x, y);
    (b') providing (102) a second semiconductor wafer (400) comprising second devices (402) in a second grid pattern (x', y');
    (a) removing (108) the non-functional first devices (302) from the first semiconductor wafer (300) in respective individual first transfer printing steps;
    (b) transferring (110) a plurality of the functional first devices (304) from the first semiconductor wafer (300) to associated second devices (402) of the second semiconductor wafer (400) in a second transfer printing step; and
    (c) transferring (112) individual functional first devices (304) of the first semiconductor wafer (300) to second devices not having first devices printed thereon in respective individual third transfer printing steps.

2. The method according to claim 1, wherein, in the second transfer printing step, the functional first devices (304) are transferred to the devices (402) of the second semiconductor wafer (400) in a third grid pattern so that second devices having functional first devices printed thereon (404) and second devices not yet having a first device printed thereon are located on the second semiconductor wafer (400) after the second transfer printing step.

3. The method according to claim 1, the method further comprising:
   (c') detecting (104) non-functional first devices (302) on the first semiconductor wafer (300) prior to removing them in the first transfer printing steps.

4. The method according to claim 3, wherein non-functional first devices (302) are detected by an optical or electrical method, especially by an automated optical or electrical inspection or a measurement.

5. The method according to claim 1, wherein the first transfer printing steps are a plurality of transfer printing steps designed for individual devices (302).

6. The method according to claim 1, wherein, in the first transfer printing steps designed for individual devices, a transfer stamp is used that is designed such that the transfer stamp picks up a single non-functional first device (302).

7. The method according to claim 1, wherein, in the first transfer printing steps designed for individual devices, a plurality of transfer stamps operating in parallel are used that are designed such that they each pick up a single non-functional first device (302).

8. The method according to claim 1, wherein the first semiconductor wafer (300) and the second semiconductor wafer (400) have the same wafer diameter.

9. The method according to claim 1, wherein, in the second transfer printing step, a transfer stamp is used that is designed such that the transfer stamp picks up a plurality of functional first devices (304) on the first semiconductor wafer (300).

10. The method according to claim 1, wherein the third transfer printing steps are transfer printing steps designed for individual devices (304).

11. The method according to claim 1, wherein, in the third transfer printing steps designed for individual devices, a transfer stamp is used that is designed such that the transfer stamp picks up a single functional first device (304).

12. The method according to claim 1, wherein, in the third transfer printing steps designed for individual devices, a plurality of transfer stamps operating in parallel are used that are designed such that they each pick up a single functional first device (304).

13. The method according to claim 1, wherein the first devices (302, 304) on the first semiconductor wafer (300) are GaN devices, and the second devices (402) on the second semiconductor wafer (400) are CMOS circuits.

14. The method according to claim 1, wherein the first devices (302, 304) on the first semiconductor wafer (300) are LEDs, Hall sensors, optical filters, or MEMS elements.

15. The method according to claim 1, wherein the first devices (302, 304) on the first semiconductor wafer (300) are CMOS circuits, and the second devices (402) on the second semiconductor wafer (400) are GaN devices.

16. The method according to claim 1, wherein the first semiconductor wafer (300) and the second semiconductor wafer (400) differ from each other, especially in the type of material, crystal orientation, wafer diameter, and/or wafer thickness.

17. The method according to claim 1, wherein the first and second devices (302, 304; 402) differ from each other, especially the in type of material, crystal orientation, geometry, and/or thickness.

18. The method according to claim 1, wherein, after transferring (112) the individual functional first devices (304) to the second devices not having first devices printed thereon (408) in respective individual third transfer printing steps, the method further comprises:
   (a'') depositing at least one insulating layer and/or at least one conductive layer on the second semiconductor wafer;
   (b'') structuring the at least one insulating layer and/or the at least one conductive layer on the second semiconductor wafer.

19. The method according to claim 1, wherein, prior to the first transfer printing steps, the first devices (302,304) on the first semiconductor wafer (300) are laterally retained by connection elements, especially after etching to free the first devices (302, 304) from the first semiconductor wafer (300) prior to the providing step (102).

20. A method of manufacturing semiconductor devices, comprising:
   (a') providing a first semiconductor disk comprising mostly functional first devices and a few non-functional first devices in a first grid pattern;
   (b') providing a second semiconductor disk comprising second devices in a second grid pattern;
   (a) removing the non-functional first devices from the first semiconductor disk (300) in respective individual first transfer printing steps;
   (b) transferring a plurality of the functional first devices from the first semiconductor disk to associated second devices of the second semiconductor disk in a second transfer printing step; and
   (c) transferring individual functional first devices of the first semiconductor disk to second devices not having first devices printed thereon in respective individual third transfer printing steps.

21. The method according to claim 20, wherein the first semiconductor disk and/or the second semiconductor disk comprises a wafer.

* * * * *